United States Patent [19]

Minami

[11] Patent Number: 5,548,227
[45] Date of Patent: Aug. 20, 1996

[54] DECISION CIRCUIT OPERABLE AT A WIDE RANGE OF VOLTAGES

[75] Inventor: Yoichiro Minami, Tokyo, Japan

[73] Assignee: NEC Corporation, Tokyo, Japan

[21] Appl. No.: 364,276

[22] Filed: Dec. 27, 1994

[30] Foreign Application Priority Data

Dec. 28, 1993  [JP]  Japan .................. 5-335276

[51] Int. Cl.⁶ ............................. H03K 19/086
[52] U.S. Cl. ............. 326/33; 326/89; 326/126; 327/74; 327/87; 327/89; 327/538
[58] Field of Search ............ 326/21, 48, 126–127, 326/31, 33, 89–90; 327/74, 77, 87–89, 530, 538

[56] References Cited

U.S. PATENT DOCUMENTS

| | | | |
|---|---|---|---|
| 4,456,840 | 7/1984 | Ide et al. | 327/89 |
| 4,527,076 | 7/1985 | Matsuo et al. | 327/88 |
| 4,560,921 | 12/1985 | Yamatake | 327/77 |
| 4,602,169 | 7/1986 | Shimizu | 327/77 |
| 5,045,807 | 9/1991 | Ishihara et al. | 326/126 |
| 5,291,122 | 3/1994 | Audy | 327/530 |

FOREIGN PATENT DOCUMENTS

| | | |
|---|---|---|
| 0275548 | 7/1988 | European Pat. Off. . |
| 1-198815 | 8/1989 | Japan . |
| 2102643 | 2/1983 | United Kingdom . |

Primary Examiner—Edward P. Westin
Assistant Examiner—Jon Santamauro
Attorney, Agent, or Firm—Sughrue, Mion, Zinn, Macpeak & Seas

[57] ABSTRACT

A decision circuit compares an input voltage with a reference voltage and judges whether the input voltage is at least equal to the reference voltage. A controller in the decision circuit detects whether the input voltage or reference voltage is at least equal to the setting voltage. When both the input voltage and the reference voltage are lower than a setting voltage, which represents an operating voltage of the decision circuit, a first bias-supply circuit adds a predetermined bias voltage to the input voltage and supplies a level-shifted input voltage to the decision circuit. Similarly, a second bias-supply circuit adds the predetermined bias voltage to the reference voltage and supplies a level-shifted reference voltage to the decision circuit. Therefore, the decision circuit compares the level-shifted input voltage with the level-shifted reference voltage.

11 Claims, 4 Drawing Sheets

5,548,227

DECISION CIRCUIT OPERABLE AT A WIDE RANGE OF VOLTAGES

BACKGROUND OF THE INVENTION

1. Field of the Invention

The present invention relates to a decision circuit having a transistor-differential amplifier, and more particularly, to a decision circuit operable at a wide range of input and reference voltages.

2. Description of the Related Art

A decision circuit or comparator typically compares an input voltage with a reference voltage and judges whether or not the input voltage is higher than the reference voltage. A conventional decision circuit or comparator, capable of operating at a low driving voltage, for example, at a Vcc of about 1 V, comprises an NPN transistor-differential amplifier. In order for the transistor of the differential amplifier to be turned on, an input voltage applied to the transistor must at least be equal to the required base-to-emitter turn-on voltage (i.e., about 0.7 V) of the transistor, and must also allow for the resulting base-to-collector voltage of the transistor to be met. Hence, the operative input voltage range for this differential amplifier is from about 0.7 V (i.e., the base-to-emitter turn-on voltage) to about 1 V (i.e., the supply voltage Vcc). Generally, a conventional comparator such as this is inoperable at a range of input voltages under the base-to-emitter voltage (e.g., 0.6 or 0.7 V), when the supply voltage is 1.0 V.

When it is desirable to lower the detection-voltage range of the decision circuit, the NPN transistor can be replaced with a PNP transistor. The detection-voltage range is an input voltage range at which the transistor is operative as a comparator. In this case, the operative input-voltage range is from ground (i.e., 0 V) to about (Vcc −0.7) V, (i.e., 0.3 V).

A technique for changing between the NPN and PNP differential amplifiers is described, for example, in Japanese Laid-Open Patent Application No. 198815/1989 (JP-A-01-198815). However, such comparators have a detection-voltage range which is so limited, that they will not operate when an input voltage as small as about one third (e.g., ⅓ V) or two thirds (e.g., ⅔ V) of the supply voltage (e.g., 1 V) is applied. Hence, this substantially limits the operability of a decision circuit, such as a portable decision circuit driven by a single battery cell, which comprises these types of comparators and is required to be operated at a low driving voltage.

SUMMARY ON THE INVENTION

It is therefore an object of the present invention to provide a decision circuit capable of operating at a wider range of input and reference voltages when being driven by a low supply voltage. To achieve this object, the present invention provides a decision circuit having a device for generating a setting voltage. This setting voltage is the voltage at which the differential amplifier becomes inoperable. When both of a reference voltage and an input voltage is lower than the setting voltage, a predetermined bias voltage is applied to both the input voltage and reference voltage, so as to raise them to voltage levels at which the differential amplifier can operate as a decision circuit. When either the reference voltage or the input voltage is higher than the setting voltage, the predetermined bias voltage is not applied to either the reference or input voltage.

BRIEF DESCRIPTION OF THE DRAWINGS

The above and other objects, features and advantages of this invention will become more apparent from the following detailed description taken with the accompanying drawings in which.

DESCRIPTION OF THE PREFERRED EMBODIMENT

Figure 1:
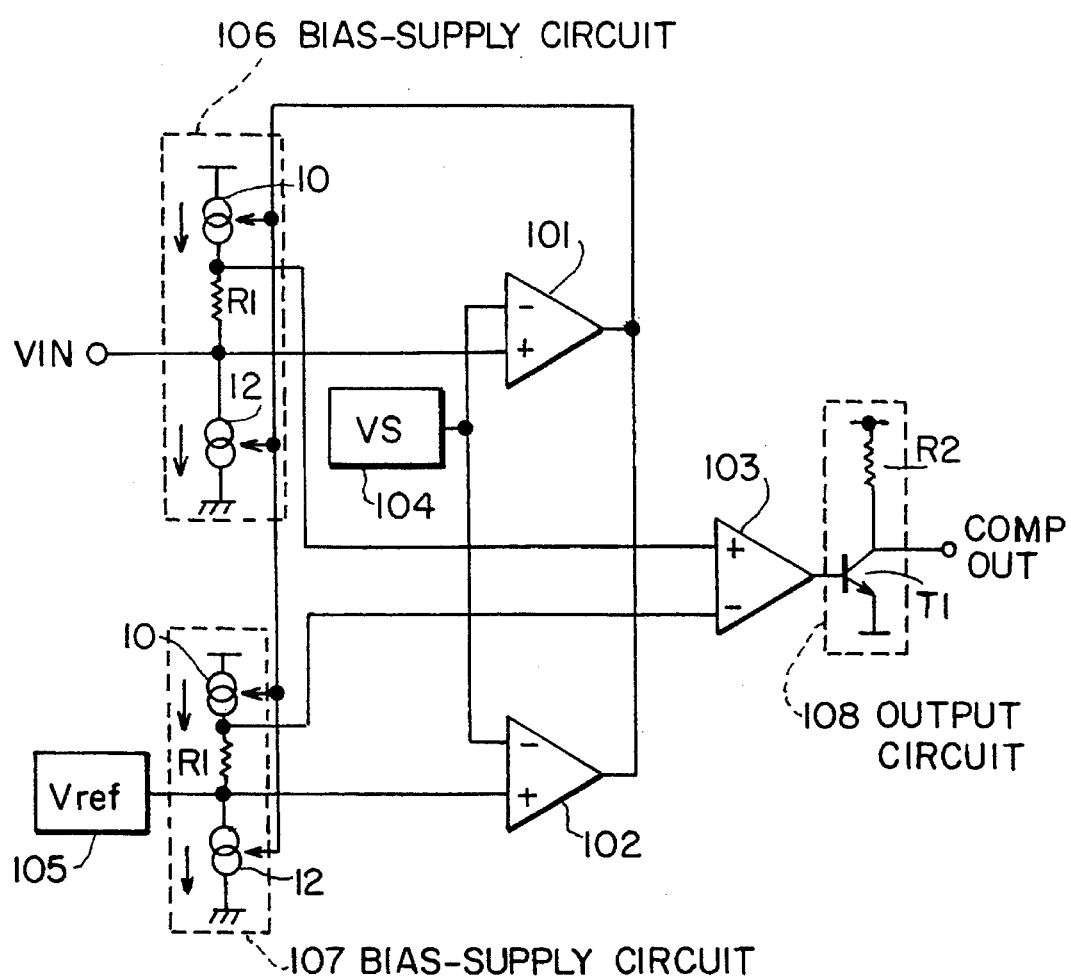
FIG. 1 is a circuit diagram of a preferred embodiment of the present invention.

FIG. 1 is a block diagram of a preferred embodiment of the present invention. In FIG. 1, a comparator or differential amplifier 101 compares an input voltage $V_{in}$ with a setting voltage VS provided by a generator 104. A comparator or differential amplifier 102 compares a reference voltage $V_{ref}$ provided by a second generator 105 with the setting voltage VS. The first and second comparators 101 and 102 and first generator 104 constitute a controller. The reference voltage can be a variable voltage or fixed voltage.

Bias-supply circuits 106 and 107, respectively, add a bias voltage to the input voltage $V_{in}$ and reference voltage $V_{ref}$ in response to a result of a decision of the controller, as described below. Output voltage signals of the bias-supply circuits 106 and 107 are supplied to a comparator or differential amplifier 103 which compares the output voltage signal of the bias-supply circuit 106 with the output voltage signal of the bias-supply circuit 107. The comparator 103 provides an output voltage signal based on this comparison to an output circuit 108.

The output circuit 108 includes an emitter-ground transistor T1 and a resistor R2. The output circuit 108 may be a current-output type circuit.

This embodiment of the decision circuit according to the present invention operates in two basic modes. If both the input and reference voltages are lower than the setting voltage VS, which is, for example, 0.6 V, a predetermined positive bias voltage, for example, 0.4 V, is added to both the input voltage $V_{in}$ and reference voltage $V_{ref}$, which are then supplied to the comparator 103 on the other hand, when either the input voltage or reference voltage is equal to or higher than the setting voltage VS, or both the input voltage and reference voltage are equal to or higher than the setting voltage VS, the comparators 101 and 102 cause the bias-supply circuits 106 and 107 to add 0 V to the input and reference voltages $V_{in}$ and $V_{ref}$. That is, the input voltage and reference voltage are directly supplied to the comparator 103.

For example, when the reference voltage $V_{ref}$ is equal to or higher than the setting voltage VS (e.g., 0.6 V), this voltage is within the operating range of third comparator 103, and hence there is no need to add the bias voltage to the reference voltage $V_{ref}$ and to the input voltage $V_{in}$. Thus, the bias supply circuits 106 and 107 provide a bias voltage of 0 V.

However, if the reference voltage $V_{ref}$ and the input voltage $V_{in}$ are both lower than the setting voltage VS, these voltages are lower than the operating range of the third comparator 103. Hence, the comparators 101 and 102 cause the bias-supply circuits 106 and 107 to add the predetermined positive bias voltage (e.g., 0.4 V) to the input and reference voltages. Accordingly, at least one voltage being input to the comparator 103 is brought into the operating range of the comparator 103 (e.g., increased to at least 0.6 V), and thus the normal comparison operation is performed.

In the decision circuit of this embodiment, the power supply driving voltage Vcc which powers the circuit is, for example, approximately 1 V. Since the predetermined positive bias voltage is 0.4 V, and the setting voltage is 0.6 V, the decision circuit can operate when both the reference voltage and input voltage are within a range of 0.2 to 0.6 V, as well as when either or both of those voltages are equal to or greater than 0.6 V. That is, if, for example, both the reference voltage and input voltage are 0.2 V, the bias voltage of 0.4 V will be added to both voltages, thereby increasing their levels to 0.6 V (the voltage level of VS), which is within the operating range of the comparator 103.

Alternatively, if both of the voltages are, for example, slightly lower than 0.6 V, when the bias voltage of 0.4 V is added to both these voltages, the voltage levels will not exceed 1 V (e.g., Vcc) after such biasing. However, if both voltages are below 0.2 V, then the bias voltage of 0.4 V will be insufficient to raise these voltages to the level of VS (0.6 V). Accordingly, the levels of the input voltage and reference voltage in this case will be below the operating voltage of comparator 103.

The bias-supply circuits 106 and 107, and the controller, will now be described. Both bias-supply circuits 106 and 107 have the same construction.

The bias-supply circuits 106 and 107 each include a pair of constant-current circuits 10 and 12, and a resistor R1, connected in series with each other. The constant-current circuit 10 is a current-output type from which a current IC1 flows out, and the constant-current circuit 12 is a current-input type into which the current IC1 flows. By this construction, the current IC1 flows through the resistor R1, and a voltage level shift of "R1 * ICI" is produced. This voltage level shift, which is the predetermined bias voltage, is added to the input voltage and reference voltage.

when one of the output signals of the comparators 101 and 102 are in an "on" state, that is, when either the input or reference voltage is equal to or higher than the setting voltage VS, the constant-current circuits 10 and 12 are turned off. Hence, no voltage level shift occurs across resistors R1 and thus, no bias voltage (a bias voltage of 0 V) is added to the input and reference voltages.

Alternatively, when both of the comparators 101 and 102 are in off-state, that is, when both of the input and reference voltages are lower than the setting voltage VS, the constant-current circuits 10 and 12 are turned on, and the voltage level shift occurs across resistors R1. Hence, the predetermined bias voltage is added to the input voltage and reference voltage.

Figure 2A:
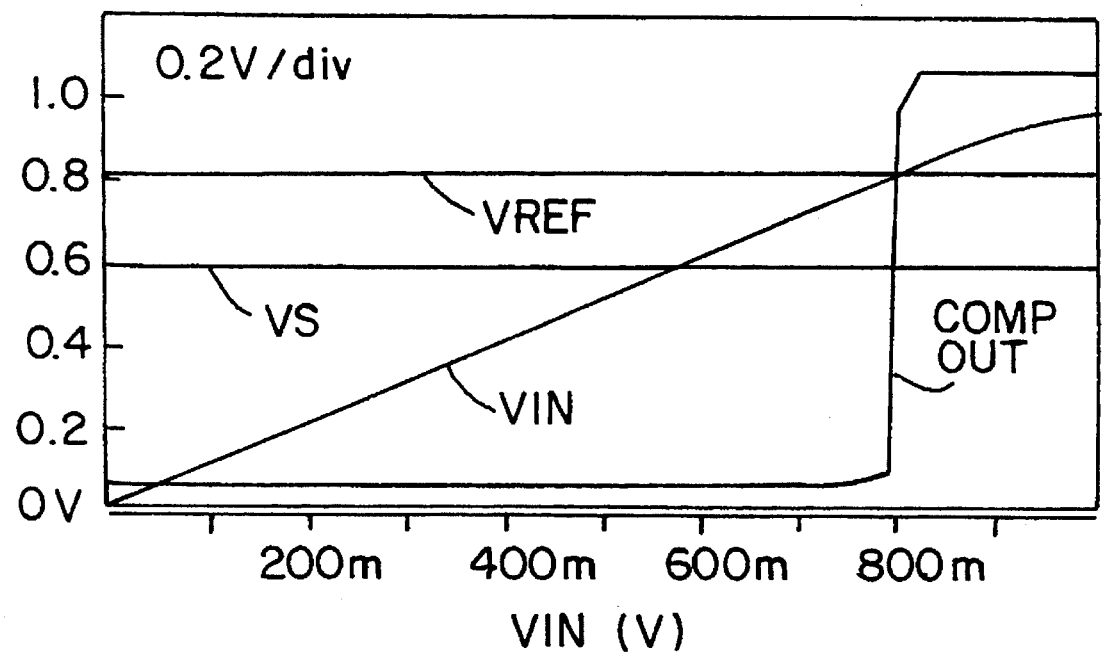
FIG. 2A is a graph of the input voltage, reference voltage, setting voltage and output voltage of the embodiment of the decision circuit shown in FIG. 1 when the reference voltage is higher than the setting voltage VS.
Figure 2B:
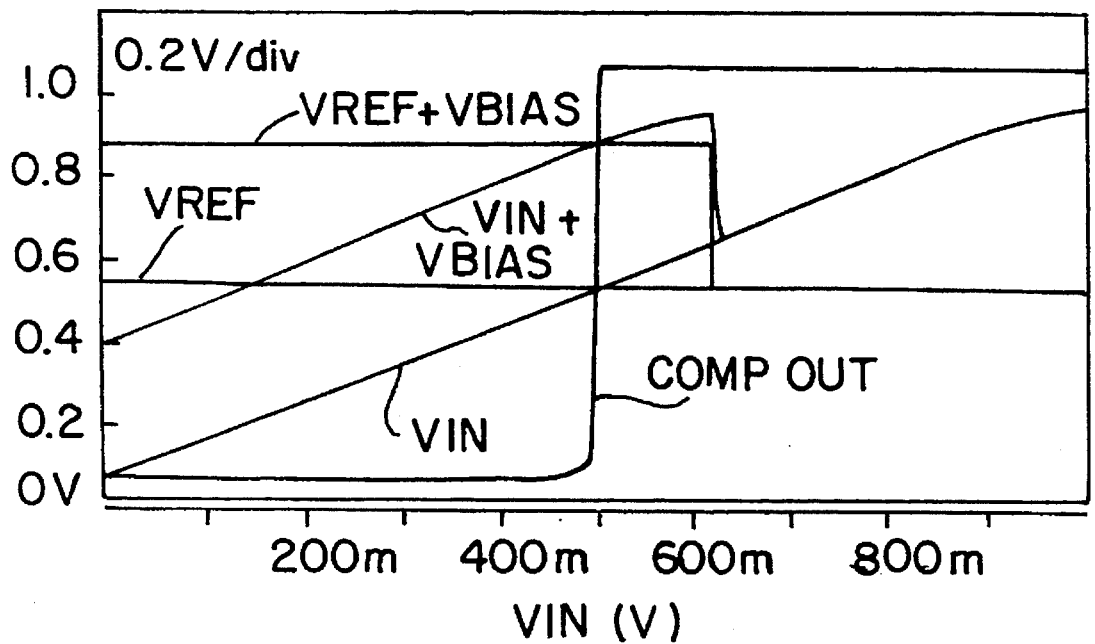
FIG. 2B is a graph illustrating the levels of the input voltage, reference voltage, setting voltage and output voltage of the embodiment of the decision circuit shown in FIG. 1 when both of the reference and input voltages are lower than the setting voltage VS, and when the input voltage becomes greater than the setting voltage VS.

The above-described operation is shown in graphs of FIG. 2A and FIG. 2B. In FIG. 2A, the reference voltage is about 0.82 V, which is higher than the setting voltage VS (0.6 V).

Hence, the bias-supply circuits give 0 V bias voltage to the input and reference voltages, and thus the input voltage and the reference voltage are output as they are to the third comparator 103.

In FIG. 2B, however, since the reference voltage 0.45 V, which is lower than the setting voltage VS (0.6 V), the positive bias voltage of 0.4 V is added to the input voltage and reference voltage by the bias-supply circuits 106 and 107, respectively, while the input voltage is below the setting voltage VS. Thus, the input and reference voltages, to which the positive bias voltage is added, are supplied to the comparator 103.

Once the input voltage becomes equal to the setting voltage VS, the output of the comparator 101 is turned on, and consequently, the bias voltage provided by the bias-supply circuits 106 and 107 becomes 0 V. Since the bias voltage of the bias-supply circuits becomes 0 V at the same time, the voltage difference between the input voltage and reference voltage is maintained, thereby preventing erroneous results from being produced by the comparator 103 due to the switching of the bias voltage from 0.4 V to 0 V.

Figure 3:
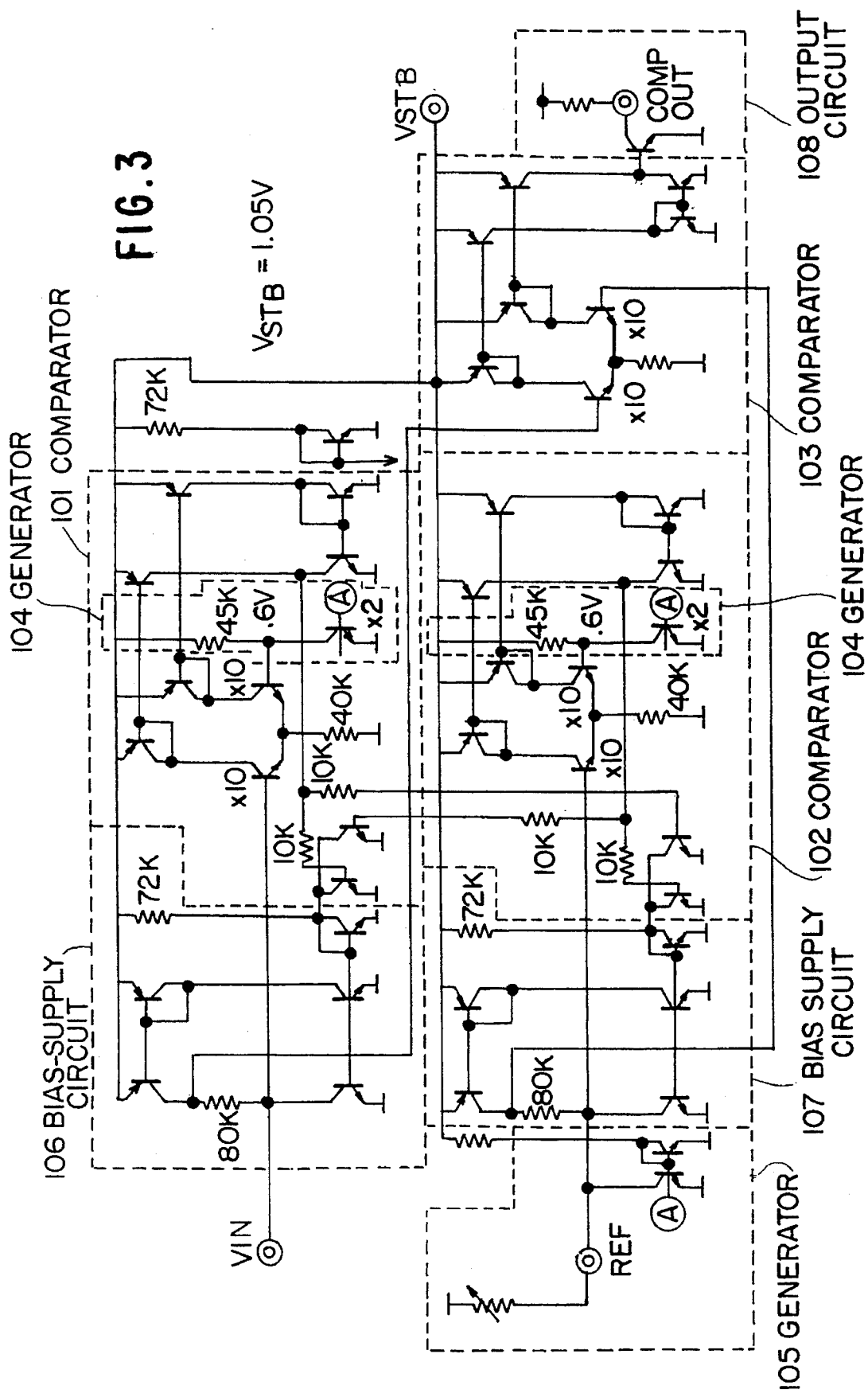
FIG. 3 is a circuit diagram of the embodiment shown in FIG. 1.

A block diagram circuit of the embodiment of FIG. 1, employing bipolar transistors, is shown in FIG. 3. The numerals identifying circuit portions in FIG. 3 correspond to the components illustrated in FIG. 1.

In the circuit, each of the comparators is a differential amplifier having an NPN transistor. Of course, the transistors need not be bipolar or NPN transistors, but can be PNP, FET or the like, based on design preference. Further, for the purpose of enabling the low-voltage operation, each common emitter is connected through a resistor (not shown) to the current source.

Figure 4:
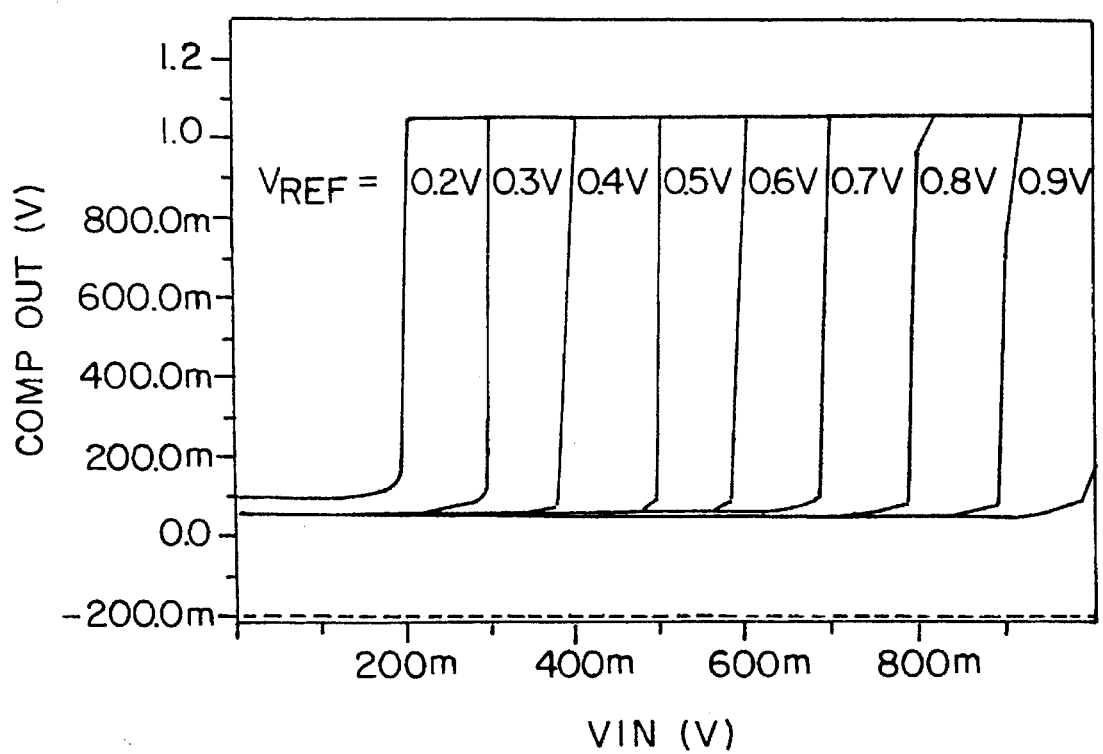
FIG. 4 is a graph illustrating relationships of output and input voltages of the embodiment of FIG. 1 for different reference voltage levels.

FIG. 4 is a graph illustrating relationships of output and input voltages of the embodiment of FIGS. 1 and 3 for different reference voltage levels. The supply voltage $V_{STB}$ (Vcc), as shown in FIG. 3, is 1.05 V. As apparent from FIG. 4, the circuit operates within a reference-voltage range of 0.2 V to 0.9 V.

While the invention has been described with reference to specific embodiments thereof, it will be appreciated by those skilled in the art that numerous variations, modifications, and embodiments are possible, and accordingly, all such variations, modifications, and embodiments are to be regarded as being within the spirit and scope of the invention.

What is claimed is:

1. A decision circuit, comprising:
    a first comparator which compares an input voltage with a reference voltage and judges whether said input voltage is higher than said reference voltage;
    a controller for controlling a level of bias voltage added to each of said input voltage and said reference voltage in response to levels of said input voltage and said reference voltage; and
    a generator which generates at least two levels of said bias voltage, said controller controlling which of said levels of said bias voltage is added to said input and reference voltages;
    wherein said controller comprises:
        a second comparator which compares said input voltage with a predetermined voltage; and
        a third comparator which compares said reference voltage with said predetermined voltage.

2. A decision circuit as claimed in claim 1, wherein said controller causes said generator to add a first level of said bias voltage to said input voltage and said reference voltage when both of said input voltage and said reference voltage are lower than said predetermined voltage, and causes said generator to add a second level of said bias voltage to said input voltage and said reference voltage when at least one of said input voltage and said reference voltage is at least equal to said predetermined voltage.

3. A decision circuit, comprising:
   a first comparator which compares an input voltage with a reference voltage and judges whether said input voltage is higher than said reference voltage;
   a controller for controlling a level of bias voltage added to each of said input voltage and said reference voltage in response to levels of said input voltage and said reference voltage; and
   an adding circuit for adding said bias voltage to said input voltage and said reference voltage and to supply an added input voltage and an added reference voltage to said first comparator;
   wherein said controller comprises:
      a generator for generating a predetermined voltage;
      a second comparator which compares said input voltage with said predetermined voltage; and
      a third comparator which compares said reference voltage with said predetermined voltage.

4. A decision circuit as claimed in claim 3, wherein said adding circuit adds said bias voltage having a first level to said input voltage and said reference voltage when both of said input voltage and said reference voltage are lower than said predetermined voltage, and adds said bias voltage having a second level to said input voltage and said reference voltage when at least one of said input voltage and said reference voltage is at least equal to said predetermined voltage.

5. The decision circuit as claimed in claim 3, wherein said adding circuit comprises:
   a first constant current circuit;
   a resistor connected to said first constant current circuit in series; and
   a second constant current circuit connected to said resistor in series;
   wherein said adding circuit supplies at least two levels of said bias voltage in response to an output signal of said controller.

6. A decision circuit, comprising:
   a first comparator which compares an input voltage with a reference voltage and judges whether said input voltage is higher than said reference voltage; and
   a controller for controlling a level of bias voltage added to each of said input voltage and said reference voltage in response to levels of said input voltage and said reference voltage;
   wherein said controller comprises:
      a generator for generating a predetermined voltage;
      a second comparator which compares said input voltage with said predetermined voltage; and
      a third comparator which compares said reference voltage with said predetermined voltage.

7. A decision circuit, comprising:
   an adding circuit for adding bias voltage to an input voltage and a reference voltage and to supply an added input voltage and an added reference voltage;
   a controller for controlling a level of said bias voltage added to said input voltage and said reference voltage in response to a level of said input voltage and said reference voltage; and
   a first comparator which compares said added input voltage with said added reference voltage and judges whether said added input voltage is at least equal to said added reference voltage;
   wherein said controller comprises:
      a generator for generating a predetermined voltage;
      a second comparator for comparing said input voltage with said predetermined voltage; and
      a third comparator for comparing said reference voltage with said predetermined voltage.

8. A decision circuit as claimed in claim 7, wherein said adding circuit comprises:
   a first bias supply circuit for adding said bias voltage having a first voltage level to said input voltage when both said input voltage and said reference voltage are lower than said predetermined voltage to supply a first bias added input voltage to said first comparator and for adding said bias voltage having a second voltage level to said input voltage when at least one of said input voltage and said reference voltage is at least equal to said predetermined voltage to supply a second bias added input voltage to said first comparator; and
   a second bias supply circuit for adding said bias voltage having said first voltage level to said reference voltage when both said input voltage and said reference voltage are lower than said predetermined voltage to supply a first bias added reference voltage to said first comparator and for adding said bias voltage having said second level to said input voltage when at least one of said input voltage and said reference voltage is at least equal to said predetermined voltage to supply a second bias added reference voltage to said first comparator.

9. A decision circuit, comprising:
   a first comparator which compares an input voltage with a reference voltage and judges whether said input voltage is at least equal to said reference voltage;
   a first generator for generating said reference voltage;
   a second generator for generating a predetermined voltage;
   a second comparator which compares said input voltage with said predetermined voltage;
   a third comparator which compares said reference voltage with said predetermined voltage;
   a first bias supply circuit for adding a first bias voltage to said input voltage when both said input voltage and said reference voltage are lower than said predetermined level voltage to supply a first bias added input voltage to said first comparator and for adding a second bias voltage to said input voltage when at least one of said input voltage and said reference voltage is at least equal to said predetermined level voltage to supply a second bias added input voltage to said first comparator; and
   a second bias supply circuit for adding said first bias voltage to said reference voltage when both of said input voltage and said reference voltage are lower than said predetermined level voltage to supply a first bias added reference voltage to said first comparator and for adding said second bias voltage to said input voltage when at least one of said input voltage and said reference voltage is at least equal to said predetermined level voltage to supply a second bias added reference voltage to said first comparator.

10. A method for determining whether an input voltage is higher than a reference voltage, the method comprising the steps of:

comparing said input voltage with a predetermined voltage;

comparing said reference voltage with said predetermined voltage;

adding bias voltages to said input voltage and said reference voltage in response to the results of both comparing steps to produce bias added input and reference voltages; and comparing said bias added input voltage with said bias added reference voltage.

11. A method as claimed in claim 10, wherein the adding step comprises the steps of:

adding a first bias voltage to said input voltage when both of said input voltage and said reference voltage are lower than said predetermined level voltage and adding a second bias voltage to said input voltage when at least one of said input voltage and said reference voltage is at least equal to said predetermined level voltage; and adding said first bias voltage to said reference voltage when both of said input voltage and said reference voltage are lower than said predetermined level voltage and adding said second bias voltage to said input voltage when at least one of said input voltage and said reference voltage is at least equal to said predetermined level voltage.

* * * * *